US005556802A

United States Patent [19]
Bakeman, Jr. et al.

[11] Patent Number: 5,556,802
[45] Date of Patent: Sep. 17, 1996

[54] METHOD OF MAKING CORRUGATED VERTICAL STACK CAPACITOR (CVSTC)

[75] Inventors: Paul E. Bakeman, Jr., South Burlington, Vt.; Bomy A. Chen, Hopewell Junction, N.Y.; John E. Cronin; Steven J. Holmes, both of Milton, Vt.; Hing Wong, Norwalk, Conn.

[73] Assignee: International Business Machines Corporation, Armonk, N.Y.

[21] Appl. No.: 486,630

[22] Filed: Jun. 7, 1995

[51] Int. Cl.$^6$ .............................................. H01L 21/8242
[52] U.S. Cl. .................. 437/52; 437/60; 437/229; 437/919; 437/977
[58] Field of Search ................... 437/47, 48, 52, 437/60, 919, 229; 257/309

[56] References Cited

U.S. PATENT DOCUMENTS

| | | | |
|---|---|---|---|
| 4,906,590 | 3/1990 | Kanetaki et al. | 437/229 |
| 5,185,282 | 2/1993 | Lee et al. | 437/52 |
| 5,284,787 | 8/1994 | Ahm | 437/919 |
| 5,292,677 | 3/1994 | Dennison | 437/52 |
| 5,438,011 | 8/1995 | Blalock et al. | 437/52 |

FOREIGN PATENT DOCUMENTS 000877  1/1994  WIPO.

Primary Examiner—Tom Thomas
Attorney, Agent, or Firm—Donald D. Mondul; Alison D. Mortinger

[57] ABSTRACT

A method for forming a capacitor on a substrate having a contact below a top layer including the steps of:

Spinning on a layer of photoresist material. Exposing the photoresist to light to establish a standing wave pattern to fix prominences of photoresist separated by separation areas. Each prominence extends a prominence height from the top layer to a top. Developing the photoresist to fix an erose face on each prominence, each face extending from the top layer to the top. Depositing a first oxide intermediate prominences to effect accumulation of the first oxide to an oxide height at least equal to the prominence height. Etching the first oxide to expose each top. Dissolving the photoresist to uncover oxide mandrels. Each mandrel extends a mandrel height from the top layer to a mandrel top; each mandrel has an erose mandrel face intermediate the top layer and the mandrel top. Etching the top layer to expose the contact. Depositing a first silicon material over selected mandrels, the top layer, and the contact intermediate the selected mandrels. Depositing photoresist over the first silicon. Etching the photoresist and the first silicon to the mandrel height to establish a node capacitor electrode. Stripping the photoresist remaining. Stripping the first oxide. Depositing a second oxide over the node electrode to establish a capacitor dielectric layer. Depositing a second silicon material over the dielectric layer to establish a plate capacitor electrode.

9 Claims, 4 Drawing Sheets

5,556,802

METHOD OF MAKING CORRUGATED VERTICAL STACK CAPACITOR (CVSTC)

BACKGROUND OF THE INVENTION

The present invention is directed to a capacitive structure formed on a semiconductor substrate. In particular, the present invention is directed to a vertical capacitor structure applied to a semiconductor substrate having a large surface area to establish large capacitance, and a method for forming such a structure.

As DRAM (Dynamic Random Access Memory) devices are increased in memory capacity to 64 Megabytes of memory capacity and beyond, vertical, stacked capacitor structures are increasingly employed to continue to meet the charge storage requirements for such devices while continuing to reduce the area occupied by the device in keeping with the continuing trend toward smaller devices.

Two basic capacitor structures have been employed to date in memory devices, such as DRAM's: trench capacitors and stacked capacitors. Trench capacitors provide a capacitive structure within a trench "dug" into a semiconductor substrate which carries gating transistors and capacitive structures. Stacked capacitors are formed upon the surface of a semiconductor substrate above the substrate surface and may be "stacked" higher as greater capacitance is desired in the capacitor.

In a typical DRAM device available today, each memory cell includes one storage capacitor and one insulated gate field effect transistor (FET). The capacitor stores information in the form of electric charges which are recognizable by a digital information processing system as a "1" (e.g., charge present) or a "0" (e.g., no charge present). The transistor functions as a transfer gate, or switch, between the capacitor and a bit line.

The alpha particle component of normal background radiation can generate hole-electron pairs in the silicon substrate often employed for semiconductor devices, and the silicon substrate then functions as a capacitor plate. As a result, a charge stored within a capacitor of a memory cell may rapidly dissipate. This dissipation of charge from a memory cell is known as a "soft" error. To assure that a capacitor holds an electric charge, and to thereby reduce the "soft" error rate, the capacitance of the capacitor should preferably be as large as possible. The capacitance C of a capacitor may be expressed as:

$$C = \epsilon \frac{A}{t}$$

where
A=capacitor electrode area,
t=thickness of insulation layer between electrodes, and
$\epsilon$=dielectric constant of the insulation layer.

A counter-consideration to designing for maximum capacitance is a desire for highly integrating the memory device into which the capacitor is incorporated. To achieve a high degree of integration, it is desirable to reduce the planar area which the capacitor occupies on a semiconductor substrate. One approach may be to assure high capacitance by reducing the thickness t of the insulation layer. However, there are limits to the amount of reduction of such thickness; one must design sufficient thickness into the insulation layer to assure the layer truly acts as an adequate insulator to enable the structure to operate as a capacitor.

As previously mentioned, a trench capacitor is one solution to the dilemma of competing design requirements associated with increasing capacitance versus reducing "real estate" (i.e., surface area) occupied on a substrate. However, trench structures appropriate for capacitive functions require prolonged etch time. Further, in view of the durability of the etch mask, the depth of a trench (and, ergo, its capacitive capabilities) is subject to practical limitations.

In both general types of capacitive structures, trench capacitors and stacked capacitors, one approach to increasing capacitance without increasing "real estate" occupancy of the semiconductor substrate has been to create erose, or corrugated, surfaces in order to increase the area of the capacitor plates within a given lateral area.

Trench capacitors with a plurality of hollows to establish an erose, or corrugated structure in the side wall of the trench, and a method for manufacturing such a capacitive structure are known.

Stacked capacitors having erose, or corrugated, sides and methods for manufacturing such a capacitive structure are known.

However, a new method for manufacturing a stacked capacitive structure having erose, or corrugated sides is needed in the art to provide alternate cost considerations and alternate choices for process parameters than are presently available to designers and practitioners. For example, a method for manufacturing a corrugated stacked capacitive structure on a semiconductor substrate that first establishes a negative three dimensional image of the desired erose plate structure before establishing the positive structure in a sacrificial mandrel for later removal would be a useful alternative method for manufacturing an erose capacitive structure.

SUMMARY OF THE INVENTION

The present invention includes a method for forming a capacitive structure on a semiconductor substrate. The substrate preferably has a generally planar top layer of nonconductive material and includes a contact structure below the top layer.

The method, in its preferred embodiment, includes the steps of:

(a) Spinning on a layer of photoresist material.

(b) Exposing the layer of photoresist material to coherent light in a manner to establish a standing wave pattern in a plurality of reflection loci. The exposing fixes a predetermined array of prominences of the photoresist material separated by at least one separation area; each respective prominence extending a prominence height from the top layer to a prominence top.

(c) Developing the photoresist material to fix a generally erose face on each respective prominence, each face extending from the top layer to the prominence top for each respective prominence.

(d) Depositing a first oxide material intermediate selected pairs of prominences. The depositing effects accumulation of the first oxide material to an oxide height which is at least equal to the prominence height.

(e) Etching the first oxide material as required to effect exposure of each prominence top.

(f) Dissolving the photoresist material to uncover a plurality of oxide mandrels; each respective mandrel extending a mandrel height from the top layer to a mandrel top, each respective mandrel having a generally erose mandrel face intermediate the top layer and the mandrel top.

(g) Etching the top layer sufficiently to at least partially expose the contact structure.

(h) Depositing a first silicon material over selected respective mandrels and over the top layer and the contact structure intermediate the selected mandrels.

(i) Depositing a photoresist material over the first silicon material.

(j) Etching the photoresist material and the first silicon material to the mandrel height or less to establish a node electrode for the capacitor.

(k) Stripping substantially all the photoresist material remaining.

(l) Stripping the first oxide material to eliminate at least the selected mandrels.

(m) Depositing a second oxide material over the node electrode to establish a dielectric layer for the capacitor.

(n) Depositing a second silicon material over the dielectric layer to establish a plate electrode for the capacitor.

It is, therefore, an object of the present invention to provide a method for forming a capacitive structure on a semiconductor substrate which provides alternate cost considerations for process parameters than are presently available to designers and practitioners.

It is also an object of the present invention to provide a method for forming a capacitive structure on a semiconductor substrate which provides alternate material choices for process parameters than are presently available to designers and practitioners.

It is yet a further object of the present invention to provide a method for forming a capacitive structure on a semiconductor substrate which first establishes a negative three dimensional image of a desired erose plate structure before establishing the positive structure in a sacrificial mandrel for later removal.

Further objects and features of the present invention will be apparent from the following specification and claims when considered in connection with the accompanying drawings illustrating the preferred embodiment of the invention.

DETAILED DESCRIPTION OF THE INVENTION

Figure 1A:
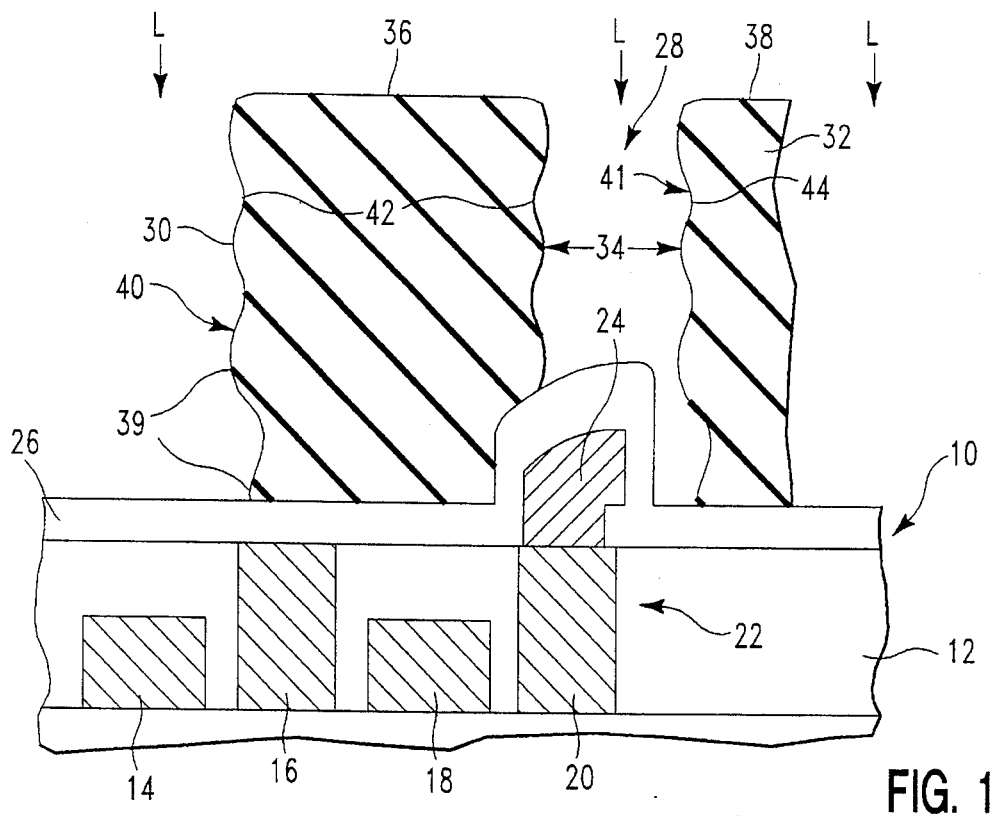
FIG. 1 is presented in FIGS. 1a through 1g; each of FIGS. 1a through 1g is a schematic sectional elevational view collectively illustrating a method for forming a capacitive structure on a semiconductor substrate.

FIG. 1a is a schematic sectional elevational view of first steps of a method for forming a capacitive structure on a semiconductor substrate. In FIG. 1a, a semiconductor substrate 10 is illustrated as including an oxide layer 12. Embedded within oxide layer 12 are conductive circuit elements 14, 16, 18, and 20. Circuit element 20 is a portion of a transistor structure 22 which includes an additional circuit element 24, additional circuit element 24 is affixed above oxide layer 12 and is electrically connected with circuit element 20.

Semiconductor substrate 10 and additional circuit element 24 are overlayed with a layer 26 of non-conductive material. Preferably, layer 26 is comprised of a nitride material.

A photoresist material is applied, preferably using a spin-on technique, to non-conductive layer 26 in an array 28 of prominences 30,32 of the photoresist material. Prominences 30,32 are separated by a separation area 34. Each prominence 30,32 extends a prominence height above non-conductive layer 26 to a prominence top 36,38.

The array 28 of prominences 30,32 is next exposed to light, preferable coherent light, in a direction substantially normal to non-conductive layer 26 (as indicated by arrows "L" in FIG. 1a) in a manner appropriate to establish a standing wave pattern in separation area 34. The standing wave pattern creates erose, or corrugated, patterns 40, 41 on the prominence faces 42, 44 of prominences 30,32.

The photoresist material comprising prominences 30,32 is then developed to fix erose patterns 40,41. Preferably, erose patterns 40,41 extend substantially the full expanse of prominence faces 42,44 from non-conductive layer 26 to prominence tops 36, 38. Of course, the frequency of the light L exposing array 28 of prominences 30,32, and other related factors known to those skilled in the art of semiconductor processing will affect the number of ridges 39 which are fixed on prominence faces 42,44.

In order to facilitate understanding of the present invention, like elements will be identified by like reference numerals in the various drawings.

Figure 1B:
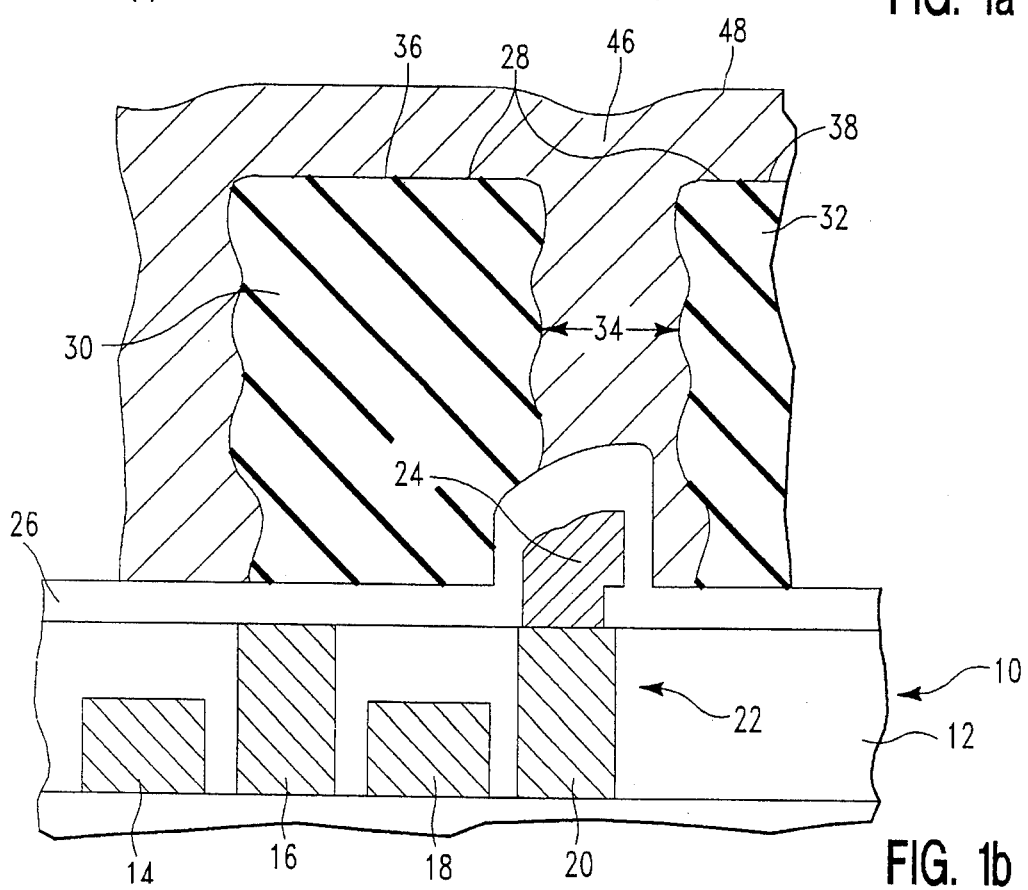

FIG. 1b is a schematic sectional elevational view of subsequent steps of a method for forming a capacitive structure on a semiconductor substrate. In FIG. 1b, semiconductor substrate 10 with its array 28 of photoresist material prominences 30,32 and non-conductive layer 26 is illustrated. A layer 46 of first oxide material is deposited over array 28 and intermediate prominences 30,32 within separation area 34. First oxide layer 46 is deposited to a deposition level 48. Deposition level 48 is sufficiently displaced from non-conductive layer 26 to ensure that prominence tops 36,38 are covered by first oxide layer 46.

Figure 1C:
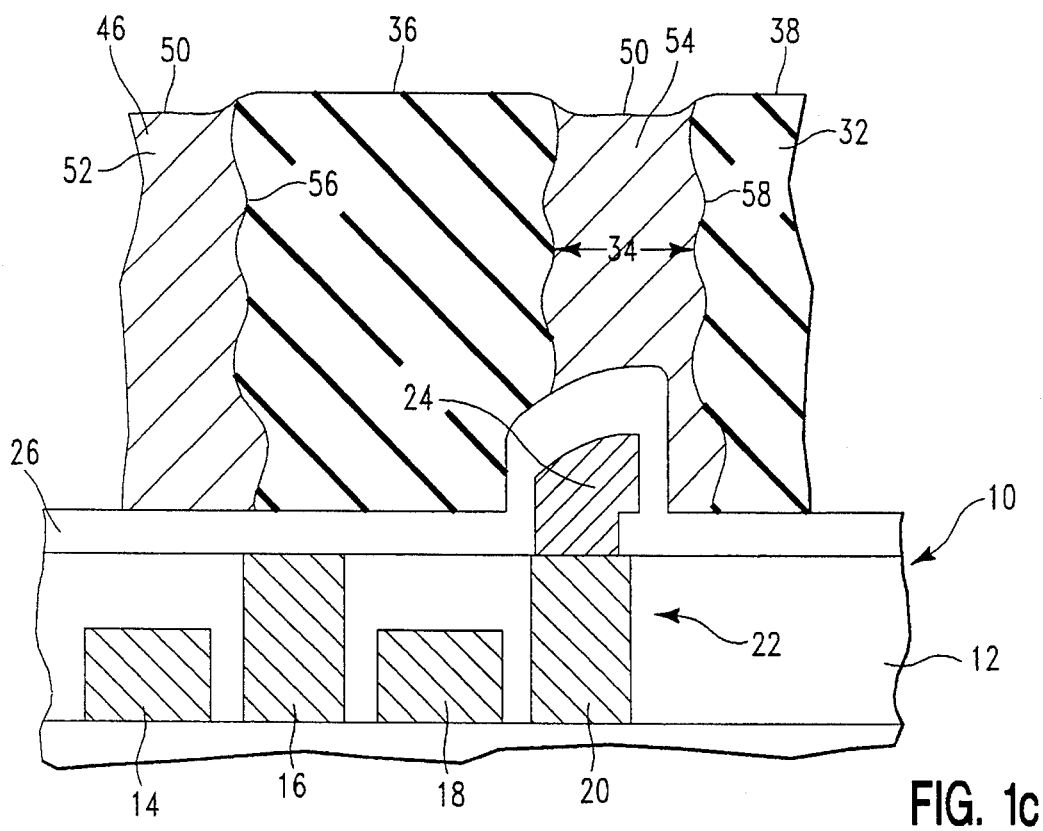

FIG. 1c is a schematic sectional elevational view of further subsequent steps of a method for forming a capacitive structure on a semiconductor substrate. In FIG. 1c, the step of etching first oxide layer 46 is illustrated. First oxide layer 46 is etched to an etched level 50. Etched level 50 is appropriately displaced from non-conductive layer 26 to ensure that prominence tops 36,38 are exposed. Consequently, separation area 34 is filled with first oxide layer 46. First oxide layer 46 is now configured as oxide mandrels 52, 54. Each oxide mandrel 52, 54 is a substantially complementary structure to its abutting prominences 30, 32. As a result, each oxide mandrel 52, 54 has an erose, or corrugated, mandrel face 56, 58 which is a substantially complementary erose pattern with respect to a respective mating prominence face 42,44.

Figure 1D:
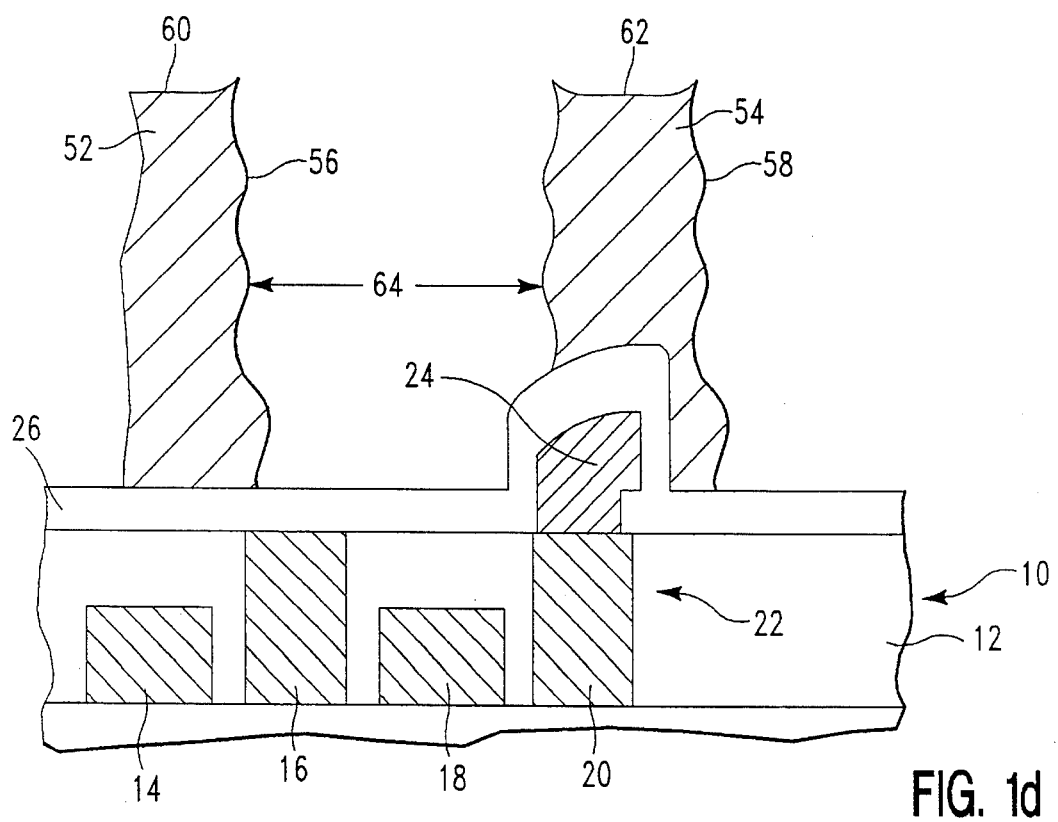

FIG. 1d is a schematic sectional elevational view of still further subsequent steps of a method for forming a capacitive structure on a semiconductor substrate. In FIG. 1d, photoresist material prominences 30, 32 have been dissolved or otherwise removed. Such a removal of prominences 30, 32 leaves oxide mandrels 52, 54 extending from non-conductive layer 26 to mandrel tops 60, 62. Oxide mandrels 52, 54 are separated by a mandrel separation area 64.

Figure 1E:
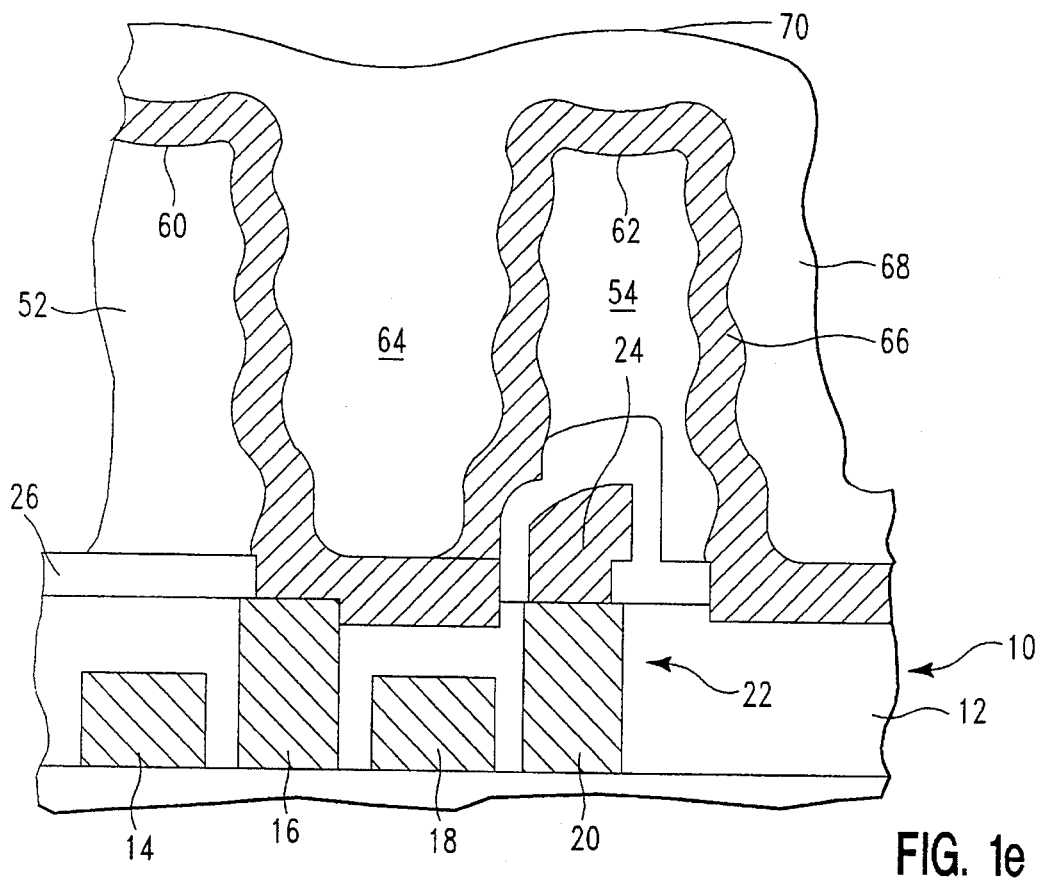

FIG. 1e is a schematic sectional elevational view of yet further subsequent steps of a method for forming a capacitive structure on a semiconductor substrate. In FIG. 1e, non-conductive layer 26 has been etched or otherwise partially removed to expose a portion of circuit element 16 within mandrel separation area 64. Subsequently, a layer 66 of first silicon material is deposited over mandrels 52, 54, over circuit element 16, and over non-conductive layer 26. A layer 68 of photoresist material is then deposited over first silicon layer 66 to a photoresist height 70. Photoresist height 70 is sufficiently displaced from non-conductive layer 26 to ensure that first silicon layer 66 is fully covered by photoresist layer 68.

Figure 1F:
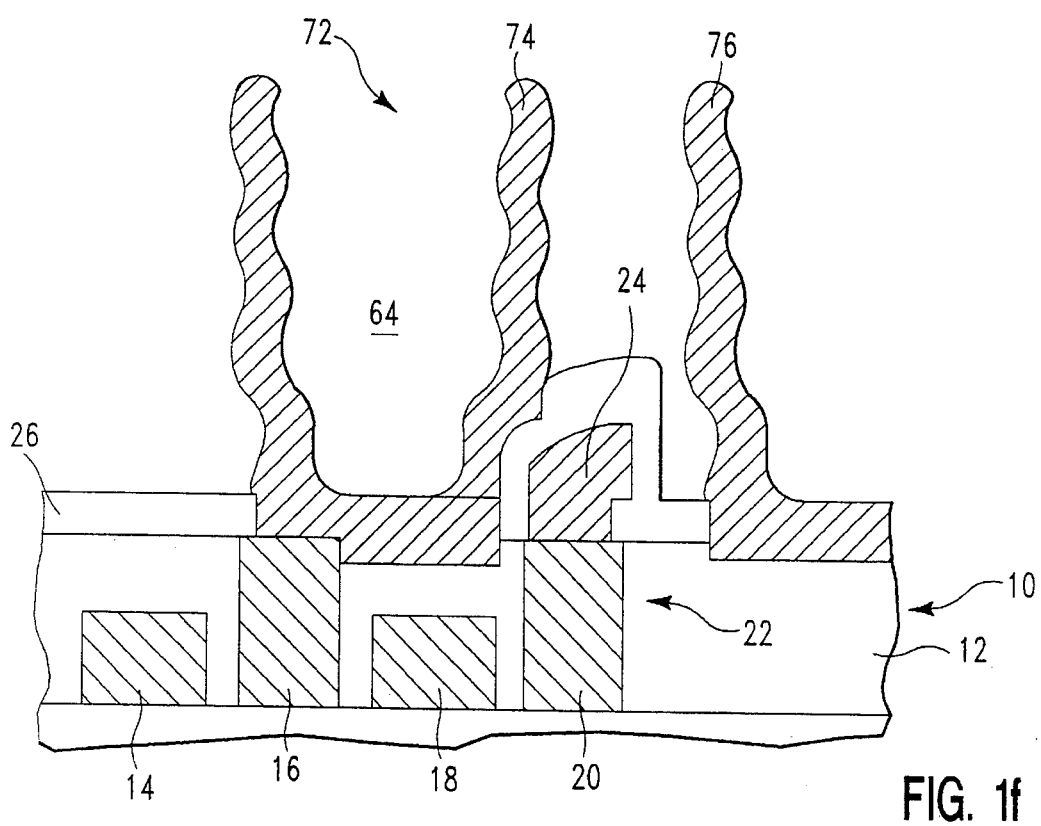

FIG. 1f is a schematic sectional elevational view of more subsequent steps of a method for forming a capacitive structure on a semiconductor substrate. In FIG. 1f, photoresist layer 68 (FIG. 1e) and first silicon layer 66 have been etched to a level exposing mandrel tops 60, 62. Then, substantially all remaining photoresist material comprising photoresist layer 68 was stripped away or otherwise removed. Oxide mandrels 52, 54 were then removed by stripping or otherwise, and the structure illustrated in FIG. 1f remained. Thus, in FIG. 1f, a silicon electrode array 72 is established. Silicon electrode array 72 is comprised of an electrically discrete first node electrode 74 and an electrically discrete second node electrode 76. Of course, the embodiment illustrated is exemplary, and a greater number of individual node electrodes may be simultaneously formed using the method steps disclosed.

First node electrode 74 is in electrical contact with circuit element 16. Second node electrode 76 can likewise be in electrical contact with a similarly situated circuit element (not shown) to establish a neighboring capacitive structure to the capacitive structure formed using first node electrode 74.

Figure 1G:
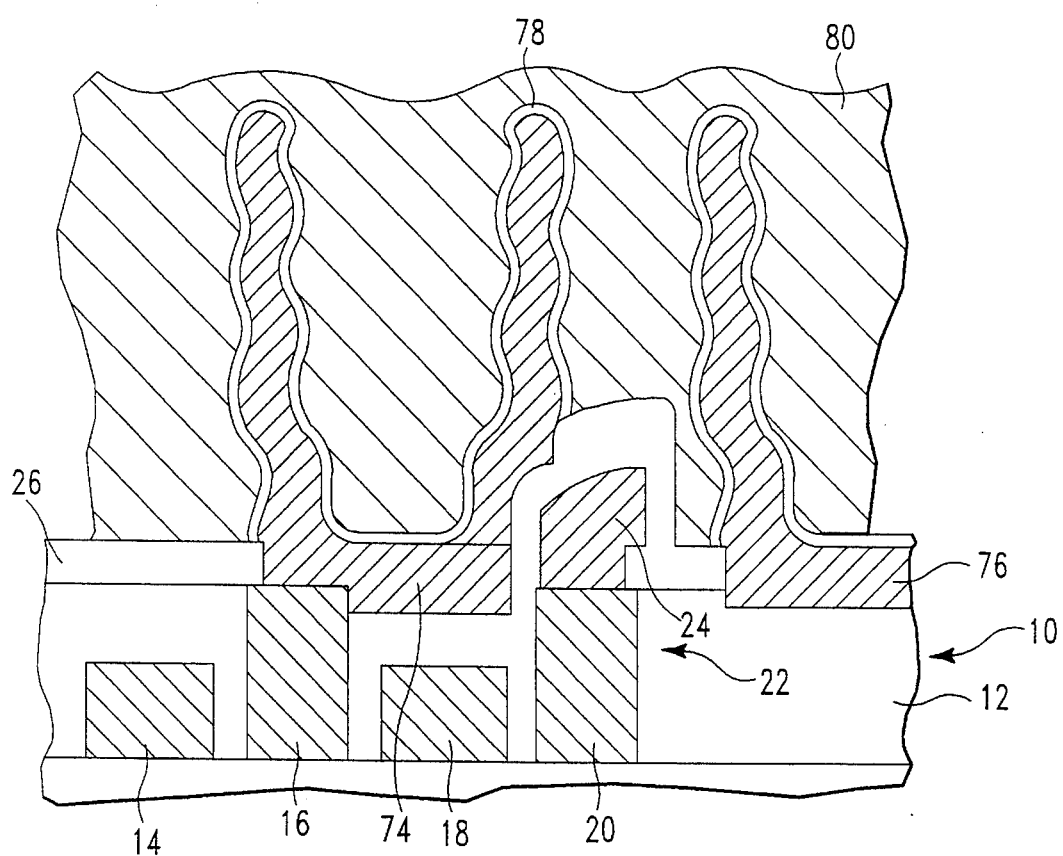

FIG. 1g is a schematic sectional elevational view of still further subsequent steps of a method for forming a capacitive structure on a semiconductor substrate. In FIG. 1g, a layer 78 of second oxide material is deposited over node electrodes 74, 76. Second oxide layer 78 forms the required dielectric for proper operation of a capacitive structure. After second oxide layer 78 is deposited, a layer 80 of second silicon material is deposited to form the required plate electrode for the capacitive structure being formed.

In such manner a capacitor is formed on semiconductor substrate 10. The exemplary capacitor includes first node electrode 74 (in electrical contact with circuit element 16), a dielectric (second oxide layer 78), and a plate electrode (second silicon layer 80).

It is to be understood that, while the detailed drawings and specific examples given describe preferred embodiments of the invention, they are for the purpose of illustration only, that the structure and method of the invention are not limited to the precise details and conditions disclosed, and that various changes may be made therein without departing from the spirit of the invention which is defined by the following claims.

We claim:

1. A method for forming a capacitive structure on a semiconductor substrate, said substrate having a top layer of a nonconductive material, said substrate including a contact structure below said top layer; the method comprising the steps of:

(a) applying a photoresist material to a top layer of said substrate so as to provide a predetermined array to establish a plurality of prominences of said photoresist material separated by at least one separation area, each respective prominence of said plurality of prominences extending a prominence height from said top layer to a prominence top;

(b) exposing said array to coherent light in a manner establishing a standing wave pattern substantially normal to said top layer within each said at least one separation area;

(c) developing said photoresist material to fix a generally erose face on each said respective prominence, each said face extending from said top layer to said prominence top for each said respective prominence;

(d) depositing a first oxide material intermediate selected pairs of prominences of said plurality of prominences, said depositing effecting accumulation of said first oxide material to an oxide height, said oxide height being at least equal to said prominence height;

(e) etching said first oxide material as required to effect exposure of each said prominence top;

(f) dissolving said photoresist material to uncover a plurality of oxide mandrels; each respective mandrel of said plurality of mandrels extending a mandrel height from said top layer to a mandrel top, each said respective mandrel having a generally erose mandrel face intermediate said top layer and said mandrel top;

(g) etching said top layer sufficiently to at least partially expose said contact structure;

(h) depositing a first silicon material over selected said respective mandrels and over said top layer and said contact structure intermediate said selected mandrels;

(i) depositing a photoresist material over said first silicon material;

(j) etching said photoresist material and said first silicon material to said mandrel height or less to establish a node electrode for said capacitive structure;

(k) stripping substantially all said photoresist material remaining;

(l) stripping said first oxide material to eliminate at least said selected mandrels;

(m) depositing a second oxide material over said node electrode to establish a dielectric layer for said capacitive structure; and (n) depositing a second silicon material over said dielectric layer to establish a plate electrode for said capacitive structure.

2. A method for forming a capacitive structure on a semiconductor substrate as recited in claim 1 wherein said top layer is comprised of a third oxide material.

3. A method for forming a capacitive structure on a semiconductor substrate as recited in claim 2 wherein said top layer is comprised of a third oxide material.

4. A method for forming a capacitive structure on a semiconductor substrate as recited in claim 1 wherein said top layer is comprised of a nitride material.

5. A method for forming a capacitive structure on a semiconductor substrate as recited in claim 2 wherein said top layer is comprised of a nitride material.

6. A method for forming a capacitor on a semiconductor substrate, said substrate having a generally planar top layer of nitride material, said substrate including a contact structure below said top layer; the method comprising the steps of:

(a) spinning a layer of photoresist material onto said top layer of said nitride material so as to provide a predetermined array to establish a plurality of prominences of said photoresist material separated by at least one separation area;

(b) exposing said layer of photoresist material to coherent light; said light cooperating with said top layer to establish a standing wave pattern in a plurality of reflection loci; said exposing fixing said predetermined array of prominences of said photoresist material separated by at least one separation area, each respective prominence of said plurality of prominences extending a prominence height from said top layer to a prominence top;

(c) developing said photoresist material to fix a generally erose face on each said respective prominence, each said face extending from said top layer to said prominence top for each said respective prominence;

(d) depositing a first oxide material intermediate selected pairs of prominences of said plurality of prominences, said depositing effecting accumulation of said first oxide material to an oxide height, said oxide height being at least equal to said prominence height;

(e) etching said first oxide material as required to effect exposure of each said prominence top;

(f) dissolving said photoresist material to uncover a plurality of oxide mandrels; each respective mandrel of said plurality of mandrels extending a mandrel height from said top layer to a mandrel top, each said respective mandrel having a generally erose mandrel face intermediate said top layer and said mandrel top;

(g) etching said top layer sufficiently to at least partially expose said contact structure;

(h) depositing a first silicon material over selected said respective mandrels and over said top layer and said contact structure intermediate said selected mandrels;

(i) depositing a photoresist material over said first silicon material;

(j) etching said photoresist material and said first silicon material to said mandrel height or less to establish a node electrode for said capacitor;

(k) stripping substantially all said photoresist material remaining;

(l) stripping said first oxide material to eliminate at least said selected mandrels;

(m) depositing a second oxide material over said node electrode to establish a dielectric layer for said capacitor; and (n) depositing a second silicon material over said dielectric layer to establish a plate electrode for said capacitor.

7. A method for forming a capacitor on a semiconductor substrate as recited in claim 6 wherein said photoresist material is spun on to a thickness of generally one micrometer.

8. A method for forming a capacitor on a semiconductor substrate as recited in claim 6 wherein said top layer is comprised of a third oxide material.

9. A method for forming a capacitor on a semiconductor substrate as recited in claim 8 wherein said top layer is comprised of a third oxide material.

\* \* \* \* \*